United States Patent
Lin

(10) Patent No.: US 6,336,199 B1
(45) Date of Patent: Jan. 1, 2002

(54) COMPUTER-READABLE RECORDING MEDIUM STORING A METHOD OF MASKING OR MODIFYING OUTPUT EVENTS OF BI-DIRECTIONAL SIGNALS IN AN EVENT-FORMAT TEST PATTERN FILE FOR A SEMICONDUCTOR INTEGRATED CIRCUIT

(75) Inventor: Richard Lin, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/261,140

(22) Filed: Mar. 3, 1999

(30) Foreign Application Priority Data

Aug. 31, 1998 (JP) .............................. 10-245786

(51) Int. Cl.$^7$ ........................ G01R 31/28; G06F 11/00
(52) U.S. Cl. .................................... 714/742
(58) Field of Search ................. 714/724, 735, 714/736, 738, 741, 742

(56) References Cited

U.S. PATENT DOCUMENTS

| | | | | |
|---|---|---|---|---|
| 4,635,256 A | * | 1/1987 | Herlein | 714/700 |
| 5,001,418 A | * | 3/1991 | Posse et al. | 324/73.1 |
| 5,142,223 A | * | 8/1992 | Higashino et al. | 714/724 |
| 5,371,851 A | * | 12/1994 | Pieper et al. | 345/507 |
| 5,446,742 A | * | 8/1995 | Vahabi et al. | 714/744 |
| 5,557,559 A | * | 9/1996 | Rhodes | 702/118 |
| 5,581,491 A | * | 12/1996 | Biwer et al. | 702/118 |
| 5,596,587 A | * | 1/1997 | Douglas et al. | 714/739 |
| 5,740,086 A | * | 4/1998 | Komoto | 702/120 |
| 5,778,004 A | * | 7/1998 | Jennion et al. | 714/724 |
| 5,845,234 A | * | 12/1998 | Testa et al. | 702/119 |
| 6,067,652 A | * | 5/2000 | Fusco et al. | 714/741 |

\* cited by examiner

*Primary Examiner*—Phung M. Chung
*Assistant Examiner*—Joseph D. Torres
(74) *Attorney, Agent, or Firm*—Burns, Doane, Swecker & Mathis, LLP

(57) ABSTRACT

A computer-readable recording medium stores a method of modifying and masking output events of bi-directional signals specified in an event-format test pattern file for a semiconductor integrated circuit, wherein the process of masking and modifying output events does not require any manual operation.

4 Claims, 10 Drawing Sheets

FIG.1

SIMOUT FILE (EVENT FORMAT FILE)

```
/*SAMPLE MEF SIMOUT FILE*/
/*irrelevant parts not shown*/
("CLOCK"=0(4,)),
("RESET"=1(4,)),
("OUTPUT_0"=2(22,)),
("BIDIR_0"=3(0,)),
("BIDIR_1"=4(0,)),
("BIDIR_2"=5(0,)),
("CONTROL_0"=6(2)),
("CONTROL_1"=7(2)),
("CONTROL_2"=8(2));
VALUE_MAP(0,"0D",0,),(1,"1D",1),
(X,"XD",2),(Z,"XZ",3);
END_HEAD_BLOCK;
EVENTS_BLOCK;
0:(0=1),(1=1).(2=2);
0:(3=2),(4=2),(5=2);
0:(6=2),(7=2),(8=2);
200:(1=0);
500:(0=0);
700:(1=1);
1000:(0=1);
1010:(2=0),(3=1),(4=1),(5=0);
1010:(6=0),(7=0),(8=0);
1500:(0=0);
2000:(0=1);
2500:(0=0);
3000:(0=1);
3010:(6=1),(7=1),(8=1);
3500:(0=0);
4000:(0=1);
4010:(3=0),(5=1);
4500:(0=0);
5000:(0=1);
5010:(5=0);
5500:(0=0);
6000:(0=1);
6010:(3=1);
6500:(0=0);
7000:(0=1);
7010:(6=0),(7=0),(8=0);
7500:(0=0);
8000:(0=1);
8010:(3=0);
8500:(0=0);
9000:(0=1);
END_EVENTS_BLOCK;
END.
```

MEFO FILE (EXPECTED PATTERN FILE)

```
/*SAMPLE MEF SIMOUT FILE*/
/*irrelevant parts not shown*/
("OUTPUT_0"=0(22,)),
("BIDIR_0"=1(0,)),
("BIDIR_1"=2(0,)),
("BIDIR_2"=3(0,)),
VALUE_MAP(0,"0D",0,),
(1,"1D",1),
(X,"XD",2),
(Z,"XZ",3);
END_HEAD_BLOCK;
EVENTS_BLOCK;
0:(0=2),(1=2),(2=2),(3=2);
1010:(1=0),(2=0);
4010:(1=1),(2=1);
5010:(1=0),(2=0);
END_EVENTS_BLOCK;
END.
```
~120

FIG.5

SIGNALPARA FILE
(DESIGN SPECIFIC INFORMATION FILE)

```
/*sample SIGNALPARA FILE*/

/*Irrelevant parts not shown*/

INPUT
    CLOCK
    RESET

OUTPUT
    OUTPUT_0;

BIDIR
    BIDIR_0,
    BIDIR_1,
    BIDIR_2;

CONTROL
    CONTROL_0,
    CONTROL_1,
    CONTROL_2;
```

110 — (file)
51 — INPUT block
52 — OUTPUT block
53 — BIDIR block
54 — CONTROL block

| Data_structure1[0]="BIDIR_0" | Data_structure2[0]="CONTROL_0" |
| --- | --- |
| Data_structure1[1]="BIDIR_1" | Data_structure2[1]="CONTROL_1" |
| Data_structure1[2]="BIDIR_2" | Data_structure2[2]="CONTROL_2" |

FIG.8

| SIGNAL NAME | SIMOUT signal name structure | MEFO signal name structure |
|---|---|---|
| "BIDIR_0" | 3 | 1 |
| "BIDIR_0" | 4 | 2 |
| "BIDIR_0" | 5 | 3 |
| "CONTROL_0" | 6 | NA |
| "CONTROL_1" | 7 | NA |
| "CONTROL_2" | 8 | NA |

FIG. 9

| | | | | | | | | | |
|---|---|---|---|---|---|---|---|---|---|
| SIMOUT BIDIR_0 | 0 | 2 | 1010 | 1 | 4010 | 0 | 6010 | 1 | 0 |
| SIMOUT BIDIR_1 | 0 | 2 | 1010 | 1 | | | | 8010 | |
| SIMOUT BIDIR_2 | 0 | 2 | 1010 | 0 | 4010 | 1 | 5010 | 0 | |
| SIMOUT CONTROL_0 | 0 | 2 | 1010 | 0 | 3010 | 1 | 7010 | 0 | |
| SIMOUT CONTROL_1 | 0 | 2 | 1010 | 0 | 3010 | 1 | 7010 | 0 | |
| SIMOUT CONTROL_2 | 0 | 2 | 1010 | 0 | 3010 | 1 | 7010 | 0 | |
| MEFO BIDIR_0 | 0 | 2 | 1010 | 0 | 4010 | 1 | 5010 | 0 | |
| MEFO BIDIR_1 | 0 | 2 | 1010 | | 4010 | 1 | 5010 | 0 | |
| MEFO BIDIR_2 | 0 | 2 | | | | | | | |

FIG.10

| | EVENT PAIR | | EVENT PAIR | | EVENT PAIR | | EVENT PAIR | | EVENT PAIR | | EVENT PAIR | | EVENT PAIR | | EVENT PAIR | |
|---|---|---|---|---|---|---|---|---|---|---|---|---|---|---|---|
| SIMOUT BIDIR_0 | 0 | 2 | 1010 | 1 | 3010 | 0 | 4010 | 1 | 5010 | 0 | 7010 | 1 | 8010 | 0 | | |
| SIMOUT BIDIR_1 | 0 | 2 | 1010 | 1 | 3010 | 0 | 4010 | 1 | 5010 | 0 | 7010 | 1 | | | | |
| SIMOUT BIDIR_2 | 0 | 2 | 1010 | 0 | 3010 | 2 | 7010 | 0 | | | | | | | | |
| SIMOUT CONTROL_0 | 0 | 2 | 1010 | 0 | 3010 | 1 | 7010 | 0 | | | | | | | | |
| SIMOUT CONTROL_1 | 0 | 2 | 1010 | 0 | 3010 | 1 | 7010 | 0 | | | | | | | | |
| SIMOUT CONTROL_2 | 0 | 2 | 1010 | 0 | 3010 | 1 | 7010 | 0 | | | | | | | | |
| MEFO BIDIR_0 | 0 | 2 | 1010 | 0 | 4010 | 1 | 5010 | 0 | | | | | | | | |
| MEFO BIDIR_1 | 0 | 2 | 1010 | 0 | 4010 | 1 | 5010 | 0 | | | | | | | | |
| MEFO BIDIR_2 | 0 | 2 | | | | | | | | | | | | | | |

EVENT TIME  EVENT VALUE

EVENT PAIR

FIG.12

MODIFIED SIMOUT FILE

```
/*SAMPLE MEF SIMOUT FILE*/
/*irrelevant parts not shown*/
("CLOCK"=0(4,)),
("RESET"=1(4,)),
("OUTPUT_0"=2(22,)),
("BIDIR_0"=3(0,)),
("BIDIR_1"=4(0,)),
("BIDIR_2"=5(0,)),
("CONTROL_0"=6(2)),
("CONTROL_1"=7(2)),
("CONTROL_2"=8(2));
VALUE_MAP(0,"OD",0,),(1,"1D",1),
(X,"XD",2),(Z,"XN",3);
END_HEAD_BLOCK;
EVENTS_BLOCK;
0:(0=1),(1=1).(2=2);
0:(3=2),(4=2),(5=2);
0:(6=0),(7=2),(8=2);
200:(1=0);
500:(0=0);
700:(1=1);
1000:(0=1);
1010:(2=0),(3=1),(4=1),(5=0);
1010:(6=0),(7=0),(8=0);
1500:(0=0);
2000:(0=1);
2500:(0=0);
3000:(0=1);
3010:(6=1),(7=1),(8=1);
3010:(3=0),(4=0),(5=2);
3500:(0=0);
4000:(0=1);
4010:(3=1),(4=1);
4500:(0=0);
5000:(0=1);
5010:(3=0),(4=0);
5500:(0=0);
6000:(0=1);

6500:(0=0);
7000:(0=1);
7010:(6=0),(7=0),(8=0);
7010:(3=1),(4=1),(5=0);
7500:(0=0);
8000:(0=1);
8010:(3=0);
8500:(0=0);
9000:(0=1);
END_EVENTS_BLOCK;
END.
```

COMPUTER-READABLE RECORDING MEDIUM STORING A METHOD OF MASKING OR MODIFYING OUTPUT EVENTS OF BI-DIRECTIONAL SIGNALS IN AN EVENT-FORMAT TEST PATTERN FILE FOR A SEMICONDUCTOR INTEGRATED CIRCUIT

BACKGROUND OF THE INVENTION

1. Field of the Invention

The present invention generally relates to integrated circuit computer aided design (CAD) software tools. Specifically, the invention describes a method, which is implemented in software, of modifying or masking output events of bi-directional signals in event-format test pattern files used in digital logic integrated circuit CAD environments.

2. Description of the Related Art

When digital microchips are tested, known signals are input to the chip, and the resulting output is compared with expected signals. If the output signals match the expected signals, then the chip is determined to be good. If not, then the chip is determined to be defective. The combination of input and output signal patterns are called test patterns.

Event-format test pattern files are known as a type of file for recording signal patterns for the testing of digital logic integrated circuits. In event-format files, signal patterns are described by statements which indicate the event time of signal transitions and the logic value which the signal transitions to. Event formats do not include statements which indicate a signal's logic value when no transitions occur.

Often, portions of the output signals are irrelevant to the test. That is, it doesn't matter what state those output signal portions are in, as they do not affect whether the chip is good or defective. These irrelevant portions of output signals then should be "masked", or excluded from the test, so that they are not compared with expected values, because if they were not masked, the microchip could be determined to be defective when it is not.

The pertinent aspects of event file formats of concern in this invention are as follows. There must exist a main event-format file or set of files which include data for input signals, output signals, and internal directional control signals for bi-directional pins. There must exist a secondary event-format file or set of files which include the modified output values or masking information for output periods of bi-directional signals. There may exist other peripheral files which are used to determine correspondence of signals in the event files with actual pins on the chip if this information is not included in the files mentioned previously. There may also exist files which determine correspondence of the internal bi-directional control signal with the external bi-directional pins if this information is not included in the files mentioned previously.

It is sometimes required to modify or mask the output events of bi-directional signals in the main event-format file or files. Presently, modifications of output events in these event-format files are done by manually modifying the events in a file using a text editor. Since in many modern designs, most pins are bi-directional, and patterns can be up to hundreds of thousands of cycles long, this method is both time consuming and error prone.

SUMMARY OF THE INVENTION

Accordingly, an object of the present invention is to efficiently automate the modification and masking of output events of event-format files in order to reduce the manual work load, reduce the overall time to accomplish the task, and to reduce the chance of human error.

Another and more specific object of the present invention is to provide a computer-readable recording medium storing a method of masking or modifying output events of bi-directional signals in an event-format test pattern file, whereby the aforementioned objectives are achieved.

BRIEF DESCRIPTION OF THE DRAWINGS

Other objects and further features of the present invention will be apparent from the following detailed description when read in conjunction with the accompanying drawings, in which:

FIG. 1 shows an example of a SIMOUT file to which the present invention is applied;

FIG. 5 shows a SIGNALPARA file used in the example described;

FIG. 8 shows results of step ST2 shown in FIG. 6;

FIG. 9 shows a data structure obtained as a result of executing step ST3 shown in FIG. 6;

FIG. 10 shows a body of data contained in a modified SIMOUT file according to the embodiment;

FIG. 12 shows the modified SIMOUT file having the data structure shown in FIG. 10.

DETAILED DESCRIPTION OF THE PREFERRED EMBODIMENT

Figure 2:
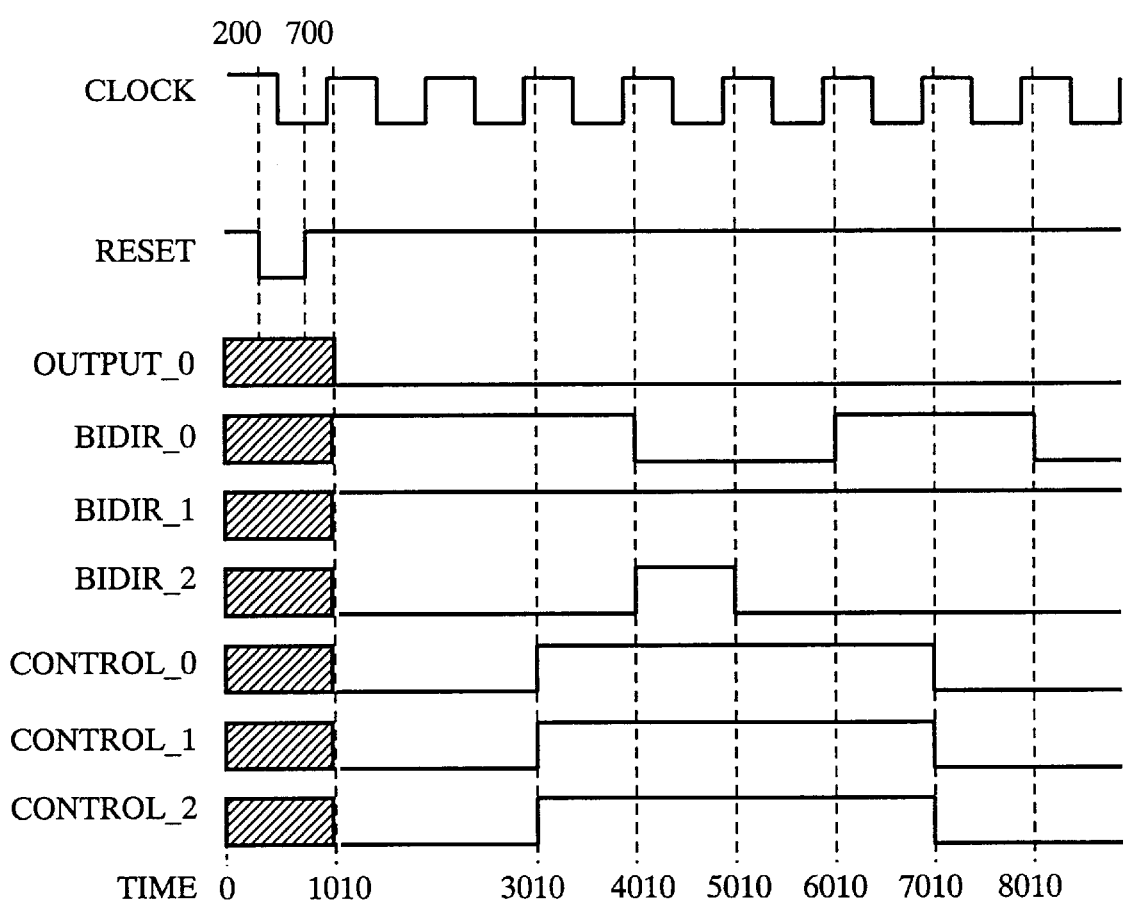
FIG. 2 is a timing chart showing signal patterns described in the SIMOUT file shown in FIG. 1.

Mitsubishi Event Format (MEF) files contain all the relevant parts for this invention and will be used as a concrete example to explain this embodiment. MEF is an event-format proprietary (that is, designed to be used specifically with Mitsubishi CoreCAD software tools) computer file format for recording signal test patterns for ASIC evaluation and testing. SIMOUT files are MEF files created from logic simulation and includes data for input signals, output signals, and internal direction control signals for bi-directional pins. When logic simulations are executed, for example, in the Mitsubishi CoreCAD system, a resulting SIMOUT file is generated which includes the results of the simulation. These SIMOUT files are MEF files with data for input signals, output signals, and internal direction control signals for bi-directional pins. An example of a SIMOUT MEF file which will be used to explain the present invention is shown in FIG. 1.

Reference numeral 10 indicates the header section of the MEF file which includes information for various characteristics of the test pattern file. A section indicated by reference numeral 20 lists signal names against associated signal numbers and signal types as follows.

| SIGNAL NAME | SIGNAL | SIGNAL TYPE |
|---|---|---|
| CLOCK | 0 | (4) = input |
| RESET | 1 | (4) |
| OUTPUT_0 | 2 | (22) = output |
| BIDIR_0 | 3 | (0) = bi-directional |
| BIDIR_1 | 4 | (0) |
| BIDIR_2 | 5 | (0) |
| CONTROL_0 | 6 | (2) = control |
| CONTROL_1 | 7 | (2) |
| CONTROL_2 | 8 | (2) |

Reference numeral 30 indicates the lines where numbers are assigned to each possible state. In FIG. 1 "0" is assigned to the low state, "1" assigned to the high state, "2" assigned to an unknown or mask state X, and "3" assigned to the high impedance state z. Reference numeral 40 indicates the events block which defines the state of each signal at a given simulation time. Each line in this block includes an event time in simulation time units (usually 1 ps or 10 ps), an example of which is indicated by the section 50, and pairs of signal number and state which identify signal transitions, an example of which is shown by the section 60. The signal pattern described by the SIMOUT file in FIG. 1 is shown in FIG. 2.

It is sometimes required that certain output signals of bi-directional pins be modified at certain cycles in this SIMOUT file. Another task sometimes required is the masking of bi-directional pin output signals in order that irrelevant comparison errors will not cause a chip to be unnecessarily determined defective during a shipment test. Previous CAD tools do not offer features to accomplish the masking or modification procedures. The conventional solution has been to manually modify the SIMOUT file by hand and replace the appropriate events in the SIMOUT file with a masking state or another desired state. In modern designs with hundreds of bi-directional pins, and test patterns with possibly thousands of cycles, this can become a very time consuming task.

This example will use existing files generated by the CoreCAD design environment to reduce the time necessary to carry out the masking or modification of output patterns in bi-directional signals of a SIMOUT file. A method to modify the SIMOUT file with a user defined expected pattern, and a method to mask unwanted bi-directional output signals are described by this invention.

The files used by this invention include a MEF SIMOUT FILE which is shown in FIG. 1 and described above, an MEF MEFO expected pattern file which is a user created/modified file that contains expected output values and masking information only; and a SIGNALPARA file which is generated by the CoreCAD system and includes design specific information for pin names and internal direction control signals for bi-directional pins. Note that the MEFO file is not required by this invention if all bi-directional output signals are to be masked. However, for selective masking and signal substitution it is required.

Figures 3, 4:
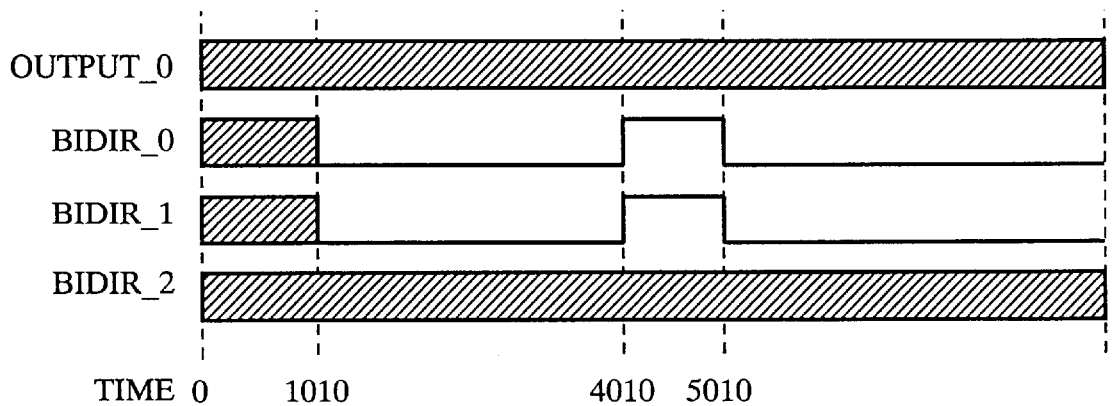
FIG. 3 shows an example of an MEFO file.
FIG. 4 is a waveform chart derived from the MEFO file shown in FIG. 3.

An example MEPO file 120 is shown in FIG. 3. Note that the MEFO file is similar to the SIMOUT file shown in FIG. 1, except that only output and bi-directional pin signals are included and signals which are to be masked are described by assigning the expected output signal to an unknown or "X" state for the entire duration of the test pattern block. FIG. 4 shows the wave diagram of the MEFO file in FIG. 3. Note that the signals "OUTPUT_0" and "BIDIR_2" are assigned the unknown state and are selectively masked.

FIG. 5 shows a SIGNALPARA file 110 for this example. A section 51 shows the input buffer type, followed by the names of the pins which are assigned input buffers. A section 52 shows the output buffer type, followed by the name of the pin which is assigned an output buffer. A section 53 shows the bi-directional buffer type followed by the pin names assigned to the bi-directional buffers. A section 54 shows the corresponding control signals names for the pins of the section 53. Note that the signal names appearing in the section 54 correspond in sequential order with the pins of the section 53. For example, "CONTROL_0" corresponds to "BIDIR_0", "CONTROL_1" corresponds to "BIDIR_1" and so on.

Figure 6:
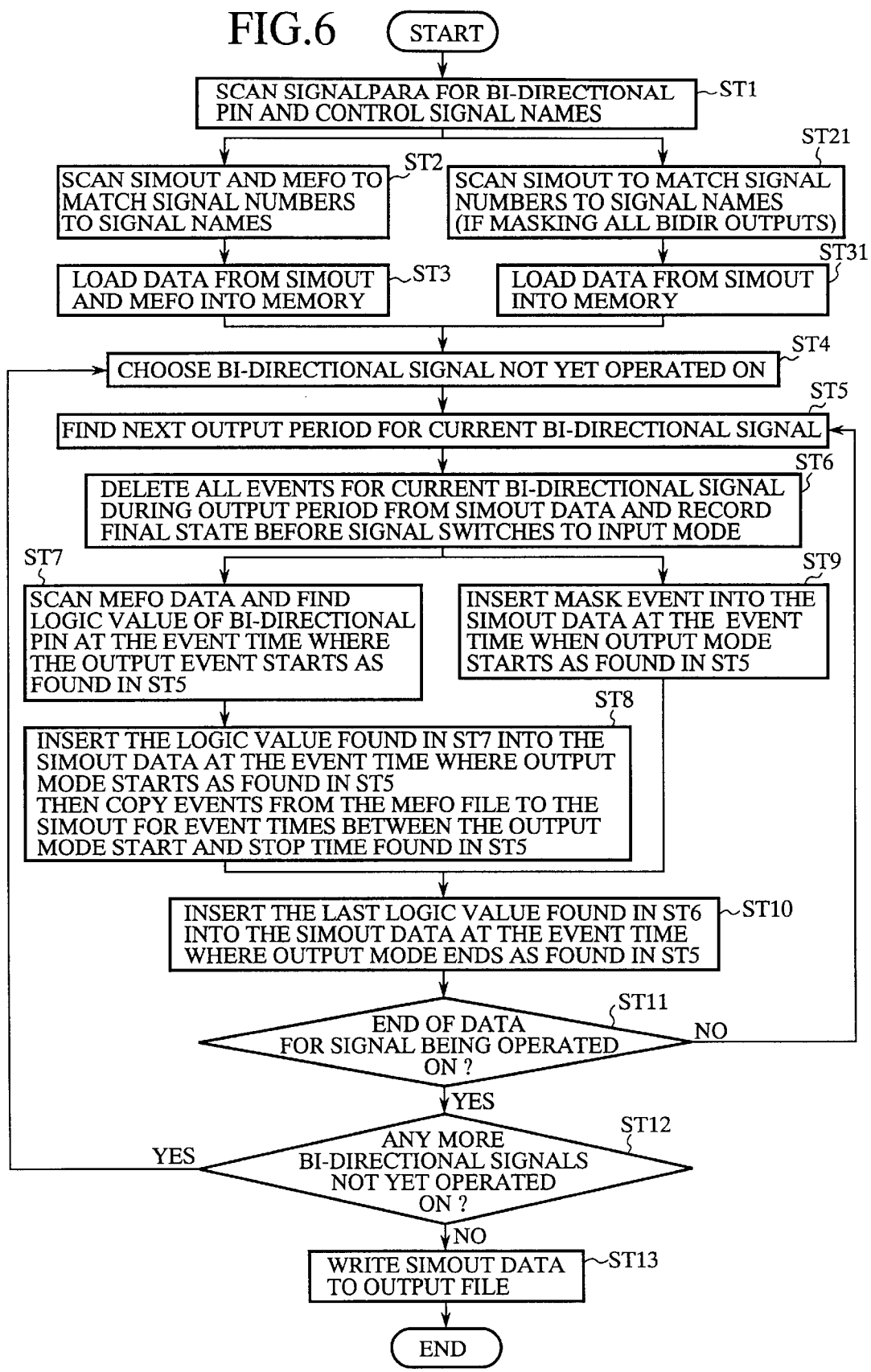
FIG. 6 is a flowchart of the operation of the masking and modification bi-directional signals in a SIMOUT file according to the embodiment.

The method by which the intended task of masking or modifying bi-directional signals in SIMOUT files is described in the numbered steps below and summarized by the flow chart in FIG. 6. In FIG. 6, where two parallel series of steps exist, the left series is provided for modifying signals and the right series is provided for masking.

Figures 7, 11:
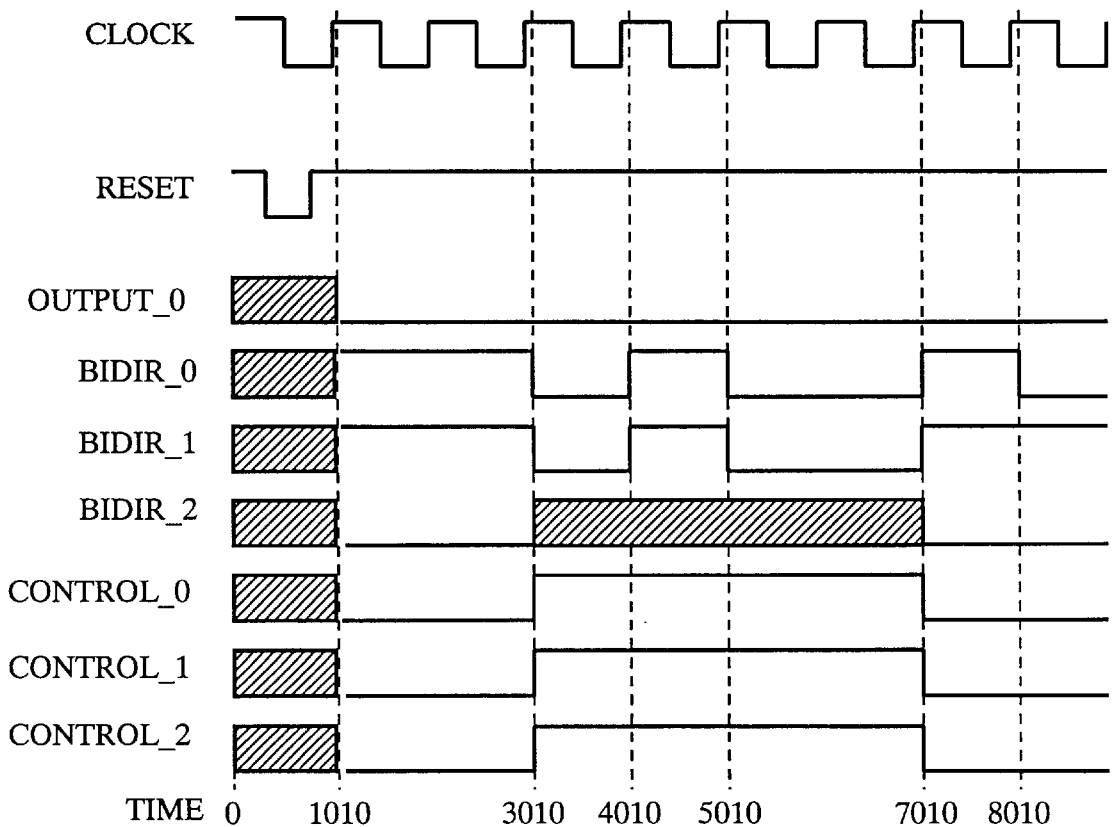
FIG. 7 shows a data structure obtained as a result of executing step ST1 of the flowchart of FIG. 6.
FIG. 11 shows a waveform chart derived from the modified SIMOUT file having the data structure shown in FIG. 10.

Referring to FIG. 6, step ST1 is performed to scan the SIGNALPARA file and store bi-directional pin names and control signal names into memory. The data structure can be an array or linked list, and which control signal corresponds to which data signal should be clearly identified. Once step ST1 has been performed on the SIGNALPARA file shown in FIG. 5, the resulting contents of the data structure is as shown in FIG. 7.

In the case of signal modification, step ST2 is performed to scan through the SIMOUT file and the MEFO file headers to match up signal names found in the step ST1 with signal numbers specific to the MEF files (SIMOUT file and the MEFO file). These signal numbers are stored in a memory in a data structure such as an array or linked list. The data structure resulting from the step ST2 performed on the files shown in FIGS. 1 and 3 is shown in FIG. 8. Each of the signal names found in the SIGNALPARA file is associated with two sets of data having respective data structures (the "SIMOUT signal name" structure, and the "MEFO signal name" structure). In the case that all bi-directional output signals are to be masked, an MEFO file is not required, and only the SIMOUT signal numbers have to be identified (steps ST21 and ST31).

Step ST3 is performed to create an event data structure in a memory for collecting events and event time from the SIMOUT file and the MEFO file. A linked list of some sort is usually the most appropriate data structure to use in this case. Usually, a separate list is required for each signal and each element in the linked list will hold the event time as a string and the event as an integer. In the case of signal modification, the resulting contents of the event data structure is as shown in FIG. 9. The MEFO signals will not appear in the case of global signal masking.

Step ST4 is then performed to choose, from the data collected in step 2, a bi-directional/control signal pair which has not yet been operated on. The selected bi-directional signal then becomes the current signal to be operated on in steps 5 to 11 described below. Step ST4 will be reiterated for each bi-directional/control signal pair before the procedure is complete.

Step ST5 is then performed to scan the events of a selected control signal in the chronological order. Step ST5 is reiterated for each output event found for the selected control signal. In the first iteration, the scan starts with the first event recorded. For following iterations, step ST5 starts where the last iterations left off. The scan continues until an output event is found. The output event time (that is, the start time of the output mode cycle) is then stored and the scan continues until the next input event or the end of the output mode cycle is found. In the example described herein, it is assumed that a bi-directional buffer is in an output mode when the control signal, specifying the direction of the data on the bi-directional signal pin, is high. In other words, it is assumed that output events occur when the control signal is high. For example, referring to FIG. 9, all the control signals have an event to "1" (output) at event time 3010 and an event to "0" at event time 7010. Thus, in the file shown in FIG. 1, step ST5 would result in 3010 and 7010 being stored as the start of the output mode cycle and the end of the output mode cycle, respectively.

Step ST6 is performed to delete all events of the bi-directional data signal associated with the control signal occurring in the output mode cycle determined in step 5. For example, referring to FIG. 9, the output events of the signal SIMOUT BIDIR_2 at event time 4010 and at event time 5010 are deleted, and do not appear in FIG. 10 (to be described later). The final state of the bi-directional data signal before the control signal switches to the input mode again, is recorded in step ST6 to be used in step ST10 as described below. In this case, the state "0" of the signal SIMOUT DIR_2 at event time 5010 is recorded in step 6.

Steps ST7 and ST8 only apply to the case where output events of bi-directional signals are modified or selectively masked. In the situation where all output events of the bi-directional pins are masked, steps 7 and 8 are skipped and step 9 (to be described below) is performed instead.

The purpose of step 7 is to scan the MEFO file to find the logic value of the bi-directional signal being operated on when the signal switches to the output mode at the event time found in step 5. To accomplish this, the MEFO file events of the bi-directional signal being operated on are scanned chronologically. Whenever an event is found, the event time of that event is compared with the start of the output mode cycle determined in step 5. If the event time from the MEFO file is equal to the event time (start of the output mode cycle) from step 5, then the logic value of the event is recorded and the procedure continues to step 8. If the event time from the MEFO file is later than the event time from step 5, or the end of the MEFO file is reached, then the procedure continues to step 8 without recording the event value. If the event time from the MEFO file is earlier than the event time from step 5, then the event value is recorded and the scan of events in the MEFO file continues.

Step ST8 is performed to copy the events of the signal being operated on from the MEFO data to the SIMOUT data. First, the SIMOUT data at the start of the output mode cycle found in step 5 is rewritten to the last event recorded in step 7. Then chronologically, events from the MEFO data for the signal being operated on are copied to the SIMOUT data until the event time in the MEFO data equals or surpasses the end of the output mode cycle determined in step 5.

Step ST9 applies only to the case of masking all signals. In this case a mask state (mask event) is assigned to the current SIMOUT data occurring at the start of the output mode cycle determined in step 5.

Step ST10 is required for both masking and modifying procedures. Here, the last event found in step 6 is written to the SIMOUT data occurring at the end of the output mode cycle determined in step 5.

Step ST11 is to determine if the test vector event time has ended. If not, the method returns to step 5 again to search for the next output period in the current bi-directional signal. If the test vector event time has ended the method proceeds to step 12.

Step ST12 is to determine if there are any bi-directional signals left which have not been operated on and if so to repeat steps 4 to 11. Once there are no more bi-directional signals left to operate on, the method proceeds to the final step.

Step ST13 is to write the modified SIMOUT information to an output file. FIG. 10 shows the final data for the modified SIMOUT file of this example and FIG. 11 shows the corresponding wave pattern. Note that, in this example, selective masks have been inserted into the output SIMOUT file by using the replace events method. More specifically, referring to FIG. 10, the mask state have been inserted for the SIMOUT BIDIR_2 signal at event time 3010 and the mask continues until event time 7010 when the CONTROL_2 signal makes the SIMOUT BIDIR_2 signal an input signal. The signal patterns of SIMOUT BIDIR_0 and SIMOUT BIDIR_1 have been modified to match MEFO BIDIR_0 and MEFO BIDIR_1 during the output period between event time 3010 and 7010.

FIG. 12 shows the actual new SIMOUT file which is the result of the process described above.

The present invention is not limited to the above-described embodiments, and variations and modifications may be made without departing from the scope of the present invention.

What is claimed is:

1. A computer-readable recording medium storing a method of modifying output events of bi-directional signals specified in an event-format test pattern file for a semiconductor integrated circuit, said method comprising the steps of:

preparing an expected pattern file for modifying the output events of the bi-directional signals to a new pattern by assigning an expected event value to desired bi-directional signals;

preparing a design specific information file storing a list of names of signal pins which include input signal pins, output signal pins and bi-directional pins, and also a list of internal direction control signals for the bi-directional pins;

extracting pairs of a bi-directional pin name and an internal direction control signal name, from said design specific information file;

matching up the bi-directional pin names and the internal direction control signal names found in said extracting step with signal representations in the event-format test pattern file and the expected pattern file;

repeating the step of matching up until the bi-directional signals and the internal direction control signals are exhausted;

collecting events and event time of the bi-directional signals and the internal direction control signals, from the event-format test pattern file and the expected pattern file;

substituting output events from the expected test pattern file into the event-format test pattern file when it is determined, by examining transitions of the internal direction control signals, that the bi-directional signals associated with the output events are in an output mode; and outputting a resultant modified event-format test pattern file.

2. A computer-readable recording medium storing a method of masking output events of bi-directional signals specified in an event-format test pattern file for a semiconductor integrated circuit, said method comprising the steps of:

preparing a design specific information file storing a list of names of signal pins which include input signal pins, output signal pins and bi-directional pins, and also a list of internal direction control signals for the bi-directional pins;

extracting pairs of a bi-directional pin name and an internal direction control signal name, from said design specific information file;

matching up the bi-directional pin names and the internal direction control signal names found in said extracting step with signal representations in the event-format test pattern file;

repeating the step of matching up until the bi-directional signals and the internal direction control signals are exhausted;

collecting events and event time of the bi-directional signals and the internal direction control signals, from the event-format test pattern file;

substituting, in the event-format test pattern file, a mask event of the desired bi-directional signal for an output event of said desired bi-directional signal; and outputting a resultant modified event-format test pattern file.

3. A method of modifying output events of bi-directional signals specified in an event-format test pattern file for a semiconductor integrated circuit, said method comprising the steps of:

preparing an expected pattern file for modifying the output events of the bi-directional signals to a new pattern by assigning an expected event value to desired bi-directional signals;

preparing a design specific information file storing a list of names of signal pins which include input signal pins, output signal pins and bi-directional pins, and also a list of internal direction control signals for the bi-directional pins;

extracting pairs of a bi-directional pin name and an internal direction control signal name, from said design specific information file;

matching up the bi-directional pin names and the internal direction control signal names found in said extracting step with signal representations in the event-format test pattern file and the expected pattern file;

repeating the step of matching up until the bi-directional signals and the internal direction control signals are exhausted;

collecting events and event time of the bi-directional signals and the internal direction control signals, from the event-format test pattern file and the expected pattern file;

substituting output events from the expected test pattern file into the event-format test pattern file when it is determined, by examining transitions of the internal direction control signals, that the bi-directional signals associated with the output events are in an output mode; and outputting a resultant modified event-format test pattern file.

4. A method of masking output events of bi-directional signals specified in an event-format test pattern file for a semiconductor integrated circuit, said method comprising the steps of:

preparing a design specific information file storing a list of names of signal pins which include input signal pins, output signal pins and bi-directional pins, and also a list of internal direction control signals for the bi-directional pins;

extracting pairs of a bi-directional pin name and an internal direction control signal name, from said design specific information file;

matching up the bi-directional pin names and the internal direction control signal names found in said extracting step with signal representations in the event-format test pattern file;

repeating the step of matching up until the bi-directional signals and the internal direction control signals are exhausted;

collecting events and event time of the bi-directional signals and the internal direction control signals, from the event-format test pattern file;

substituting, in the event-format test pattern file, a mask event of the desired bi-directional signal for an output event of said desired bi-directional signal; and outputting a resultant modified event-format test pattern file.

* * * * *